United States Patent
Pattinson et al.

(10) Patent No.: US 10,316,882 B2
(45) Date of Patent: Jun. 11, 2019

(54) COATING FOR A THREADED COMPONENT AND A METHOD OF APPLYING THE SAME

(71) Applicant: ROLLS-ROYCE PLC, London (GB)

(72) Inventors: Glen Pattinson, Derby (GB); Lloyd Pallett, Derby (GB)

(73) Assignee: ROLLS-ROYCE plc, London (GB)

( * ) Notice: Subject to any disclaimer, the term of this patent is extended or adjusted under 35 U.S.C. 154(b) by 358 days.

(21) Appl. No.: 15/202,151

(22) Filed: Jul. 5, 2016

(65) Prior Publication Data
US 2017/0030395 A1 Feb. 2, 2017

(30) Foreign Application Priority Data
Jul. 30, 2015 (GB) .................................. 1513385.3

(51) Int. Cl.
| | |
|---|---|
| F16B 35/04 | (2006.01) |
| F16B 33/06 | (2006.01) |
| C23C 14/16 | (2006.01) |
| C23C 14/48 | (2006.01) |
| C23C 28/02 | (2006.01) |
| C23C 14/14 | (2006.01) |
| C23C 16/06 | (2006.01) |

(52) U.S. Cl.
CPC ............. *F16B 33/06* (2013.01); *C23C 14/14* (2013.01); *C23C 14/16* (2013.01); *C23C 14/48* (2013.01); *C23C 16/06* (2013.01); *C23C 28/023* (2013.01)

(58) Field of Classification Search
CPC .......... F16B 33/06; C23C 16/06; C23C 16/10
USPC ....................................................... 411/424
See application file for complete search history.

(56) References Cited

U.S. PATENT DOCUMENTS

| | | | | |
|---|---|---|---|---|
| 3,926,569 A | * | 12/1975 | Hage ................ | F16B 33/008 205/109 |
| 4,091,173 A | * | 5/1978 | Hage ................ | F16B 33/008 411/387.1 |
| 4,982,596 A | * | 1/1991 | Peterson .......... | B21J 13/02 470/191 |
| 5,096,352 A | * | 3/1992 | Lemelson ........ | B24D 18/00 411/424 |
| 5,332,348 A | * | 7/1994 | Lemelson ........ | B23D 61/185 411/157 |
| 7,144,208 B2 | * | 12/2006 | Henderer ......... | B23G 5/06 408/144 |
| 7,842,403 B2 | * | 11/2010 | Meyer, Jr. ....... | C09D 7/40 428/686 |

(Continued)

FOREIGN PATENT DOCUMENTS

| | | |
|---|---|---|
| DE | 102013213503 A1 | 8/2014 |
| EP | 2541079 A1 | 1/2013 |

OTHER PUBLICATIONS

Sep. 1, 2015 British Search Report issued in Great Britain Patent Application No. 1513385.3.

(Continued)

*Primary Examiner* — Gary W Estremsky
(74) *Attorney, Agent, or Firm* — Oliff PLC

(57) ABSTRACT

A method of providing a threaded fastener with a multi-layered coating comprises the step of using a vapor deposition process to apply a multi-layered coating to a threaded portion of the threaded fastener, each layer of the multi-layered coating being formed from a coating material selected from the group comprising titanium, chromium, nickel, platinum, tantalum, and combinations thereof.

8 Claims, 1 Drawing Sheet

(56) References Cited

U.S. PATENT DOCUMENTS

| | | | |
|---|---|---|---|
| 2002/0092586 A1 | 7/2002 | Weir | |
| 2002/0107578 A1* | 8/2002 | Speitling | A61B 17/7233 623/23.6 |
| 2013/0170922 A1* | 7/2013 | Persson | B21D 53/22 411/161 |
| 2014/0126977 A1* | 5/2014 | Bae | F16B 37/14 411/427 |

OTHER PUBLICATIONS

Nov. 21, 2016 European Search Report issued in European Patent Application No. 16177887.

* cited by examiner

COATING FOR A THREADED COMPONENT AND A METHOD OF APPLYING THE SAME

This disclosure claims the benefit of UK Patent Application No. 1513385.3, filed on 30 Jul. 2015, which is hereby incorporated herein in its entirety.

FIELD OF THE DISCLOSURE

The present disclosure relates to a coating for a threaded component and particularly, but not exclusively, to an anti-seize coating for a threaded component.

BACKGROUND TO THE DISCLOSURE

Seizure of threaded fasteners is commonly attributed to galling between the two substrates, and results from cold welding of the substrate materials. Both silver or silver compounds, and dry film lubricants, are commonly used to provide anti-seize capability to the threaded joint.

Coatings of silver or silver compounds may be applied to either, or both, of the internal and external threaded portions of mechanical fasteners, in order to reduce the frictional forces when assembling or disassembling the fastener, and to ameliorate the tendency of the fastener to seize.

Similar improvements in frictional performance and anti-seize behaviour may be achieved by the application of dry film lubricants to the threaded portions. These dry film lubricants are generally based upon molybdenum disulphide, graphite or other lubricious oxides.

The silver or silver compounds are applied to the threaded portions by an electroplating process, while dry film lubricants may be applied by means of dip, spray or brush coating and subsequent curing.

Typical coating thicknesses range between 5 and 20 microns, with both the internal and external thread forms being dimensioned to accommodate the coating thicknesses.

Both silver and silver-based coatings, and dry film lubricant coatings, act to reduce friction by shearing within the coating. In particular, silver compounds have been shown to prevent seizure of mated threaded components where local loading is in excess of 1 GPa.

However, the mechanical properties of both silver and silver-based coatings and dry film lubricant coatings results in the deformation of the coating during assembly of the threaded joint.

It is therefore necessary to modify build practices (torque and end loads, recognition of increased scatter) in order to accommodate the mechanical deformation of the coating layer(s).

Silver also has significant health concerns both in terms of the plating process itself and as a contaminant within the engine. Silver and silver-based coatings are associated with significant corrosion problems. This is especially prevalent for base materials of nickel and/or titanium alloy in the presence of sulphur or chlorine. The resulting degradation of the coating in the engine environment can result in silver migration, and/or combination with sulphur and chlorine. This in turn can cause accelerated corrosion or one or more of the base materials.

Dry film lubricants on the other hand, although not providing the health problems of silver are subject to large variability in composition and coverage. As such, these coatings do not provide the same level of performance and/or reusability as silver, while also promoting corrosion due to the elements and compounds used in the pigment or binder.

STATEMENTS OF DISCLOSURE

According to a first aspect of the present disclosure there is provided a method of providing a threaded fastener with a multi-layered coating, the threaded fastener comprising a threaded portion, the method comprising the step of:

using a vapour deposition process to apply a multi-layered coating to the threaded portion, each layer of the multi-layered coating being formed from a coating material selected from the group comprising titanium, chromium, nickel, platinum, tantalum, and combinations thereof.

The use of a multi-layered coating in which the coating material is selected from the group comprising titanium, chromium, nickel, platinum, tantalum, and combinations thereof, provides shear bands at the interfaces between the discrete layers of the coating material. This enables the multi-layered coating to provide a low friction, anti-seize property to an assembled joint between threaded components coated with the multi-layered coating of the present disclosure.

The selection of coating materials from the group comprising titanium, chromium, nickel, platinum, tantalum, and combinations thereof results in a coating having higher mechanical strength, together with higher thermal and chemical stability than silver or dry film lubricant based coatings. This provides for improved control over the assembly and disassembly torques, which enables a user to have more precise and repeatable control over the assembly properties of the corresponding threaded joint In addition, the use coating materials from the group comprising titanium, chromium, nickel, platinum, tantalum, and combinations thereof results in the elimination of the possibility of corrosive damage caused by the coating material.

The method of the present disclosure provides for the deposition of a multi-layered coating to a component that is temperature stable, corrosion resistant and adhesively compatible with the substrate whilst not causing deformation of the substrate or interfering with the engineering tolerances of the component. This combination of coating properties cannot readily be achieved by conventional silver-based or dry film lubricant coatings.

Optionally, the vapour deposition process is a physical vapour deposition process, or a chemical vapour deposition process.

The use of a vapour deposition process provides for the deposition of a high purity, thin film coating onto a surface.

Optionally, the multi-layered coating comprises between ten and seventy individual coating layers.

Multi-layering the coating architecture aims to mimic the shear properties of silver-based and dry film lubricant coatings under extreme loads by exploiting the interface between discrete layers as shear bands.

Optionally, the method comprises the additional step of:

performing ion implantation during the vapour deposition process, using ions from a material selected from the group comprising titanium, chromium, nickel, platinum, tantalum, and combinations thereof.

Ion implantation, or 'ion doping' may be employed during the deposition process of forming the multi-layer coating to improve the lubrication performance of the multi-layered coating.

Ion doping is a technique by which species that can modify the surface or bulk properties or provide a lubricating phase may be introduced during coating deposition on a scale appropriate to the coating.

Optionally, the step of:

using a vapour deposition process to apply a multi-layered coating to the threaded portion, each layer of the multi-layered coating being formed from a coating material selected from the group comprising titanium, chromium, nickel, platinum, tantalum, and combinations thereof, comprises the step of:

using a vapour deposition process to apply a plurality of layers, of a coating material, to the threaded portion, each of the plurality of layers having a thickness in the range of 10 nm to 100 nm, the coating material being selected from the group comprising titanium, chromium, nickel, platinum, tantalum, and combinations thereof.

Optionally, the step of:

using a vapour deposition process to apply a plurality of layers, of a coating material, to the threaded portion, each of the plurality of layers having a thickness in the range of 10 nm to 100 nm, the coating material being selected from the group comprising titanium, chromium, nickel, platinum, tantalum, and combinations thereof, comprises the step of:

using a vapour deposition process to apply a plurality of layers, of a coating material, to the threaded portion, each of the plurality of layers having a thickness in the range of 10 nm to 100 nm, to form a multi-layered coating having a thickness in the range of 0.5 µm to 15 µm, the coating material being selected from the group comprising titanium, chromium, nickel, platinum, tantalum, and combinations thereof.

According to a second aspect of the present disclosure there is provided a threaded fastener comprising a threaded portion, wherein the threaded portion is coated with a multi-layer coating, each layer of the multi-layered coating being formed from a coating material selected from the group comprising titanium, chromium, nickel, platinum, tantalum, and combinations thereof.

Optionally, the multi-layered coating comprises between ten and seventy individual coating layers.

Optionally, each layer of the multi-layer coating has a thickness in the range of 10 nm to 100 nm.

Optionally, the multi-layer coating has a thickness in the range of 0.5 µm to 15 µm.

Other aspects of the disclosure provide devices, methods and systems which include and/or implement some or all of the actions described herein. The illustrative aspects of the disclosure are designed to solve one or more of the problems herein described and/or one or more other problems not discussed.

BRIEF DESCRIPTION OF THE DRAWINGS

There now follows a description of an embodiment of the disclosure, by way of non-limiting example, with reference being made to the accompanying drawings in which.

It is noted that the drawings may not be to scale. The drawings are intended to depict only typical aspects of the disclosure, and therefore should not be considered as limiting the scope of the disclosure.

DETAILED DESCRIPTION

Figure 1:
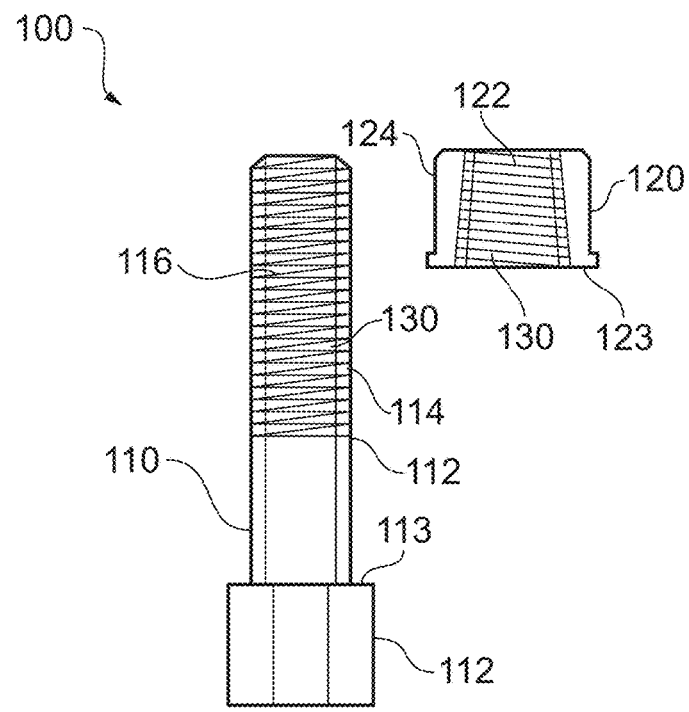
FIG. 1 shows a schematic sectional view of a threaded fastener incorporating a surface coating according to the present disclosure.
Figure 2:
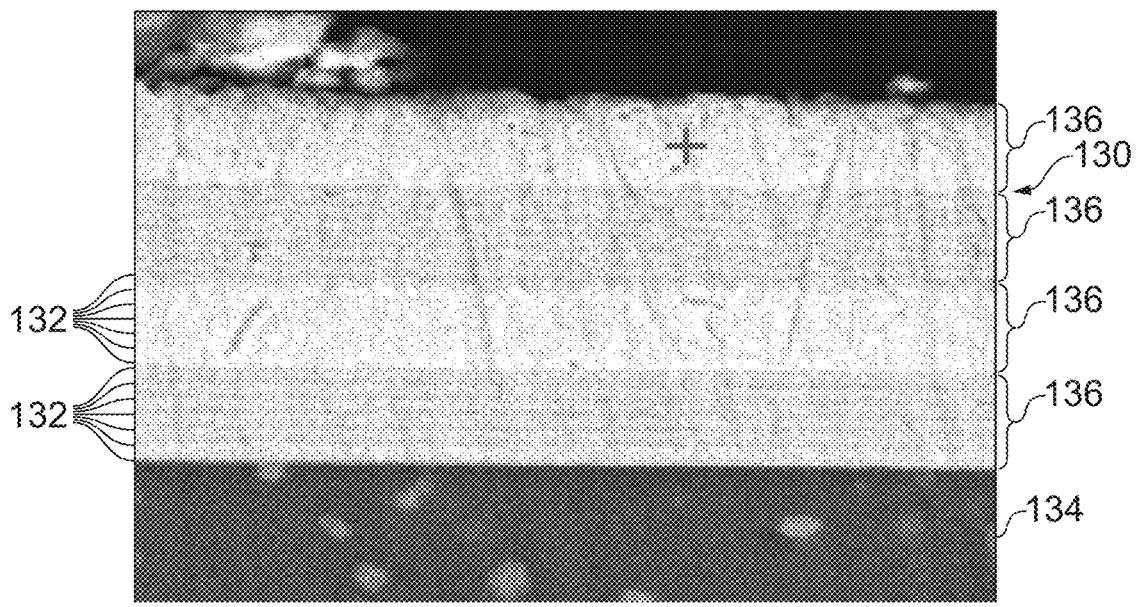
FIG. 2 shows a cross-sectional view of the surface coating of FIG. 1.

Referring to FIGS. 1 and 2, a threaded fastener incorporating a surface coating according to an embodiment of the disclosure is designated generally by the reference numeral 100.

In the embodiment shown in FIG. 1, the threaded fastener 100 comprises a bolt 110 and a threaded nut 120. The bolt 110 comprises a head 112, a first seating face 113, a shank portion 114, and a male threaded portion 116. The threaded nut 120 comprises a female threaded portion 122, a second seating face 123, and an external profile 124.

In this embodiment, the male threaded portion 116 of the bolt 110, and the female threaded portion 122 of the threaded nut 120, are each provided with a surface coating 130.

Referring to FIG. 2, the surface coating 130 comprises a plurality of individual layers 132 applied to the base material 134 of the threaded portions 116,122.

In other arrangements, the surface coating 130 may be applied to other portions of the threaded fastener 100. For example, the surface coating 130 may be applied to one or more of the shank portion 114, the first seating face 113, and the second seating face 123.

The layers 132 of the multi-layered coating 130 are applied to the base material 134 of the threaded fastener 100 by means of a vapour deposition process.

Vapour deposition processes are well known material processing techniques for applying high purity, thin film coatings to the surface of a component.

Two examples of vapour deposition processes are physical vapour deposition and chemical vapour deposition. Physical vapour deposition involves entirely physical processes such as, for example, high-temperature vacuum evaporation with subsequent condensation, or plasma sputter bombardment. In contrast, chemical vapour deposition involves a chemical reaction at the surface to be coated.

The multi-layered surface coating 130 of the present disclosure is applied to the respective surfaces of the threaded component 100 by a physical vapour deposition process.

There are several variants of physical vapour deposition process. These include, inter alia, cathodic arc deposition, electron beam deposition, evaporative deposition, pulsed laser deposition, and sputter deposition. These variants of the physical vapour deposition process are well known and are therefore not described further in this disclosure.

In the present arrangement, a physical vapour deposition process is used to deposit a plurality of thin layers 132 onto the threaded portions 116,122.

The thin layers 132 are formed from metallic species of titanium, chromium, nickel, platinum, and tantalum.

In the surface coating 130 shown in FIG. 2, the base material 134 is provided with a multi-layered surface coating 130 comprising forty individual layers 132. Each of these individual layers 132 is formed from nickel.

Each of the forty layers 132 has a thickness of 40 nm. The forty layers 132 are arranged as four layer groups 136, with each of the layer groups 136 comprising ten individual layers 132.

In the present arrangement, each of the individual layers 132 forming a single layer group 136 is formed from the same material, namely nickel. In other arrangements, each of the individual layers 132 forming a single layer group 136 may be formed from a different one of the metallic species outlined above.

In the present arrangement, the multi-layered surface coating 130 has a total thickness of approximately 2.4 µm.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person of skill in the art are included within the scope of the disclosure as defined by the accompanying claims.

What is claimed is:

1. A threaded fastener comprising a threaded portion,
   wherein the threaded portion is coated with a multi-layer coating, each layer of the multi-layered coating being formed from a coating material selected from the group consisting of titanium, chromium, nickel, platinum, tantalum, and combinations thereof, and
   wherein the threaded fastener is adapted to receive a threaded nut.

2. The threaded fastener as claimed in claim 1, wherein the multi-layered coating comprises between ten and seventy individual coating layers.

3. The threaded fastener as claimed in claim 1, wherein each layer of the multi-layer coating has a thickness in the range of 10 nm to 100 nm.

4. The threaded fastener as claimed in claim 1, wherein the multi-layer coating has a thickness in the range of 0.5 μm to 15 μm.

5. The threaded fastener as claimed in claim 1, wherein the coating material is nickel.

6. The threaded fastener as claimed in claim 1, wherein each individual coating layer forming a single layer group of the multi-layer coating is formed from the same coating material.

7. The threaded fastener as claimed in claim 1, wherein individual coating layers forming a single layer group of the multi-layer coating are not all formed from the same coating material.

8. The threaded fastener as claimed in claim 1, wherein the multi-layer coating is the outermost coating of the threaded fastener.

* * * * *